(12) United States Patent
Wang

(10) Patent No.: US 11,587,641 B2
(45) Date of Patent: Feb. 21, 2023

(54) FUSE FAULT REPAIR CIRCUIT

(71) Applicant: CHANGXIN MEMORY TECHNOLOGIES, INC., Hefei (CN)

(72) Inventor: Kejun Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 4 days.

(21) Appl. No.: 17/498,083

(22) Filed: Oct. 11, 2021

(65) Prior Publication Data

US 2022/0277803 A1    Sep. 1, 2022

Related U.S. Application Data

(63) Continuation of application No. PCT/CN2021/105069, filed on Jul. 7, 2021.

(30) Foreign Application Priority Data

Mar. 1, 2021  (CN) .......................... 202110224959.3

(51) Int. Cl.
*G11C 17/16*  (2006.01)
*G11C 29/00*  (2006.01)
*G11C 17/18*  (2006.01)

(52) U.S. Cl.
CPC ............ *G11C 29/787* (2013.01); *G11C 17/16* (2013.01); *G11C 17/18* (2013.01)

(58) Field of Classification Search
CPC ....... G11C 29/787; G11C 17/16; G11C 17/18; G11C 2029/4402
USPC ............................................. 365/225.7, 201
See application file for complete search history.

(56) References Cited

U.S. PATENT DOCUMENTS

| | | |
|---|---|---|
| 7,405,989 B2 | 7/2008 | Chung |
| 7,724,601 B2 | 5/2010 | Chung |
| 8,395,923 B2 | 3/2013 | Chen |
| 9,589,675 B2 | 3/2017 | Kim et al. |
| 9,847,142 B2 | 12/2017 | Kim et al. |
| 9,978,463 B2 | 5/2018 | Kim et al. |
| 10,559,375 B2 | 2/2020 | Shim |
| 10,726,937 B2 | 7/2020 | Shim |

(Continued)

FOREIGN PATENT DOCUMENTS

| | | |
|---|---|---|
| CN | 1832047 A | 9/2006 |
| CN | 102272854 A | 12/2011 |

(Continued)

*Primary Examiner* — Michael T Tran
(74) *Attorney, Agent, or Firm* — Cooper Legal Group, LLC

(57) ABSTRACT

A fuse fault repair circuit includes a fuse array, a signal storage module, and a scan repair module. The fuse array includes a redundant fuse array and a non-redundant fuse array. When the fuse array is not faulty, the redundant fuse array has no signal output, and the non-redundant fuse array outputs S first logic signals. Each storage unit in the signal storage module is configured to store a first logic signal sent by one fuse unit connected thereto. The scan repair module is configured to scan the storage units in the signal storage module, determine, when a faulty storage unit is scanned, that a first fuse unit connected to the faulty storage unit is faulty, and replace the first fuse unit with a first redundant fuse unit corresponding to the first fuse unit. The first logic signal corresponding to the first redundant fuse unit is a normal signal.

12 Claims, 3 Drawing Sheets

(56) References Cited

U.S. PATENT DOCUMENTS

| | | | |
|---|---|---|---|
| 10,839,932 B2 | 11/2020 | Shim | |
| 10,853,542 B1* | 12/2020 | Sengupta | G06F 30/33 |
| 11,049,585 B1* | 6/2021 | Hung | G11C 11/409 |
| 11,244,741 B1* | 2/2022 | Wieduwilt | G11C 29/76 |
| 2006/0197178 A1 | 9/2006 | Chung | |
| 2007/0079052 A1* | 4/2007 | Hasegawa | G11C 29/54 |
| | | | 711/100 |
| 2008/0023700 A1* | 1/2008 | Gschwind | G01R 31/318569 |
| | | | 257/48 |
| 2008/0252361 A1 | 10/2008 | Chung | |
| 2010/0165699 A1 | 7/2010 | Chen | |
| 2012/0243354 A1* | 9/2012 | Loh | G11C 29/52 |
| | | | 365/201 |
| 2013/0027056 A1* | 1/2013 | Parris | G11C 29/027 |
| | | | 324/550 |
| 2016/0071613 A1* | 3/2016 | Ko | G11C 17/16 |
| | | | 365/96 |
| 2017/0018316 A1 | 1/2017 | Kim et al. | |
| 2017/0040066 A1 | 2/2017 | Kim et al. | |
| 2017/0133109 A1 | 5/2017 | Kim et al. | |
| 2017/0270852 A1* | 9/2017 | Meitl | G09G 3/32 |
| 2019/0066819 A1* | 2/2019 | Lovett | G11C 11/412 |
| 2019/0108893 A1 | 4/2019 | Shim | |
| 2019/0279706 A1* | 9/2019 | Kim | G11C 29/787 |
| 2020/0143900 A1 | 5/2020 | Shim | |
| 2020/0303031 A1 | 9/2020 | Shim | |
| 2021/0125678 A1* | 4/2021 | Cho | H01L 23/5252 |

FOREIGN PATENT DOCUMENTS

| | | |
|---|---|---|
| CN | 101828258 B | 9/2015 |
| CN | 106356099 A | 1/2017 |
| CN | 109658973 A | 4/2019 |

\* cited by examiner

FUSE FAULT REPAIR CIRCUIT

CROSS-REFERENCE TO RELATED APPLICATION

This is a continuation application of International Patent Application No. PCT/CN2021/105069, filed on Jul. 7, 2021, which claims priority to Chinese Patent Application No. 202110224959.3, filed with the China Patent Office on Mar. 1, 2021 and entitled "FUSE FAULT REPAIR CIRCUIT". International Patent Application No. PCT/CN2021/105069 and Chinese Patent Application No. 202110224959.3 are incorporated herein by reference in their entireties.

TECHNICAL FIELD

The disclosure relates to, but is not limited to, a fuse fault repair circuit.

BACKGROUND

One Time Programmable (OTP) is a type of memory in a semiconductor memory. An electronic fuse is a kind of OTP, and can, for example, be an anti-fuse. In the use of the semiconductor memory, especially in the case of slightly adjusting circuit parameters of the semiconductor memory and repairing some manufacturing problems of the semiconductor memory, etc., the electronic fuse has been widely used. Compared with other storage technologies, the reading operation of the electronic fuse storage is an automatic operation that cannot be customized. That is, the reading order of the electronic fuse memory will be fixed after the completion of the design.

The production and use of the electronic fuse are easily affected by the process. However, with the development of the semiconductor process, the volume of the semiconductor memory is required to be decreased, which causes the fault rate of the electronic fuse to be increased. If the electronic fuse is faulty, the semiconductor memory containing the electronic fuse will not work due to the fault, which causes a great waste of the semiconductor memory.

SUMMARY

According to embodiments of the disclosure, there is provided a fuse fault repair circuit. The fuse fault repair circuit includes:

a fuse array, of which an input end is configured to be connected to a power supply end, and an output end is configured to output S first logic signals, wherein the fuse array includes M fuse units; each of the fuse units outputs one first logic signal, S and M are both integers greater than zero, and S is less than M; the M fuse units include a redundant fuse array and a non-redundant fuse array, the redundant fuse array has no signal output when the fuse array is not faulty, and the non-redundant fuse array outputs the S first logic signals;

a signal storage module, including at least M storage units, each of the storage units being configured to store a first logic signal sent by one fuse unit connected thereto; and a scan repair module in signal connection with the signal storage module and configured to scan the storage unit in the signal storage module, determine, when a faulty storage unit has been scanned, that a first fuse unit connected to the faulty storage unit is faulty, and replace the first fuse unit with a first redundant fuse unit corresponding to the first fuse unit, wherein a first logic signal stored in the faulty storage unit is a fault signal, the first redundant fuse unit belongs to the redundant fuse array, and a first logic signal corresponding to the first redundant fuse unit is a normal signal.

DESCRIPTION OF REFERENCE NUMERALS

Figure 1:
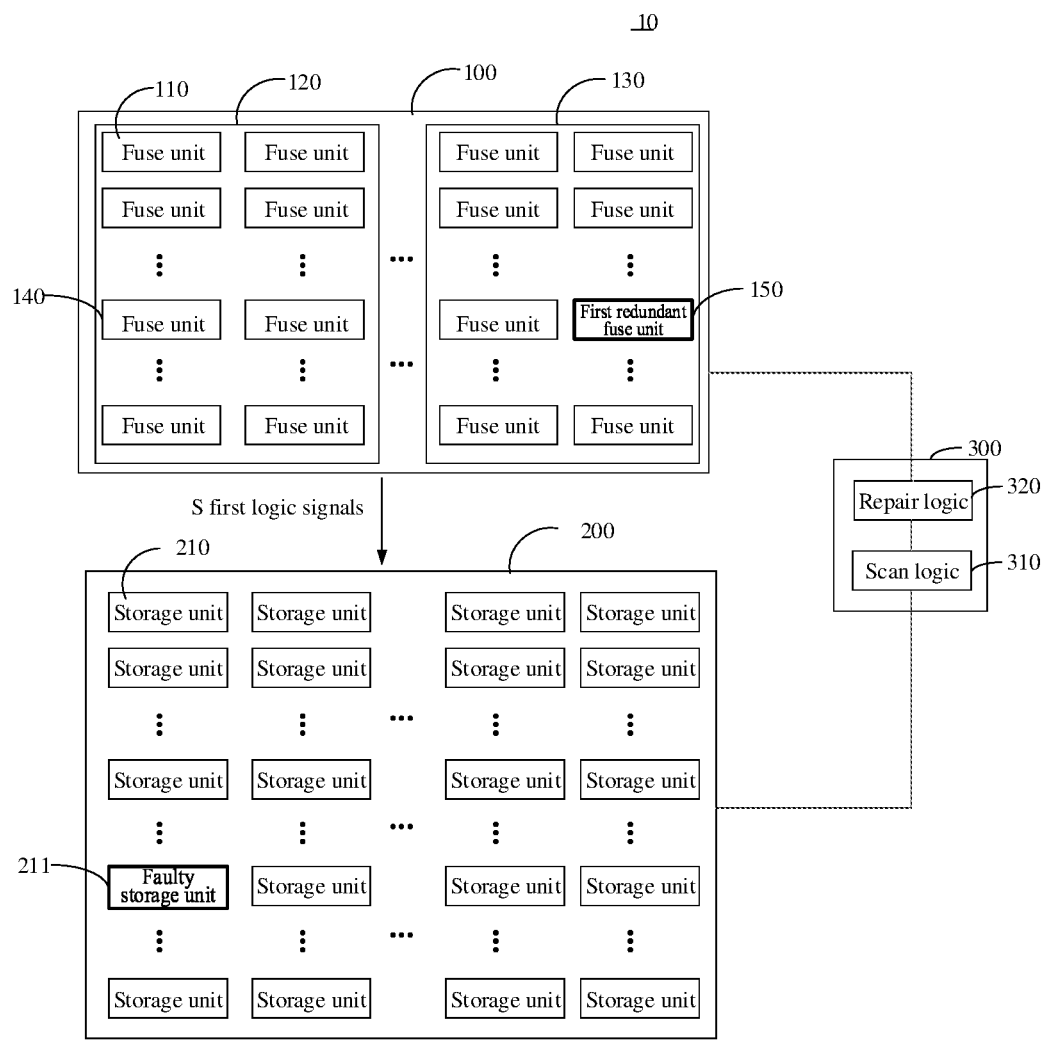
FIG. 1 is a schematic diagram of a fuse fault repair circuit provided in some embodiments of the disclosure.

Fuse fault repair circuit 10
Fuse array 100
Fuse unit 110
Fuse 111
Transistor 112
Inverter 113
Redundant fuse array 120
Non-redundant fuse array 130
First fuse unit 140
First redundant fuse unit 150
Signal storage module 200
Storage unit 210
Faulty storage unit 211
Redundant storage unit 220
Non-redundant storage unit 230
Signal detection circuit 240
Scan repair module 300
Scan logic 310
Repair logic 320
Redundant signal detection unit 400
Electrical fuse memory 20

DETAILED DESCRIPTION

Exemplary embodiments will be described here in detail, and examples thereof are represented in the accompanying drawings. When the following description relates to the accompanying drawings, unless otherwise indicated, the same numbers in different accompanying drawings represent the same or similar elements. The implementations described in the following exemplary embodiments do not represent all implementations consistent with the disclosure. On the contrary, they are merely examples of apparatuses and methods consistent with some aspects of the disclosure as detailed in the appended claims.

OTP is a type of memory in a semiconductor memory. An electronic fuse is an OTP, and can, for example, be an anti-fuse. With the development of the semiconductor process, the volume of the semiconductor memory is required to be decreased. However, the production and use of the electronic fuse are easily affected by the process. Therefore, the smaller the volume of the semiconductor memory, the higher the fault rate of the electronic fuse. Moreover, if the electronic fuse is faulty, the semiconductor memory containing the electronic fuse will not work due to the fault, which causes a great waste of the semiconductor memory.

The electronic fuse semiconductor memory includes an anti-fuse array. The anti-fuse array includes a non-redundant fuse array and a redundant fuse array. When the electronic fuse semiconductor memory is used without fault, the redundant fuse array is in a standby state and is not used, and the non-redundant fuse array is in a used state. If the non-redundant fuse array is faulty, which will directly cause the electronic fuse semiconductor memory to be faulty, and thus the electronic fuse semiconductor memory is disused.

Therefore, the disclosure provides a fuse fault repair circuit 10. The fuse fault repair circuit 10 can scan out faulty fuse units in the non-redundant fuse array of the anti-fuse array, and the faulty fuse units are then replaced with fuse units in the redundant fuse array. As a result, the non-redundant fuse array is repaired, and the situation that the entire semiconductor memory is disused due to the fault of the non-redundant fuse array is avoided.

The following describes the structure and the operation principle of the fuse fault repair circuit 10 provided in the disclosure in detail.

Referring to FIG. 1, the fuse fault repair circuit 10 provided in the embodiment includes a fuse array 100, a signal storage module 200, and a scan repair module 300.

An input end of the fuse array 100 is configured to be connected to a power supply end, and an output end of the fuse array 100 is configured to output S first logic signals. The fuse array 100 includes M fuse units 110. Each of the fuse units 110 outputs one first logic signal correspondingly. S and M are both integers greater than zero, and S is less than M. The M fuse units 110 include a redundant fuse array 120 and a non-redundant fuse array 130. When the fuse array 100 is not faulty, the redundant fuse array 120 has no signal output, and the non-redundant fuse array 130 outputs the S first logic signals.

Figure 2:
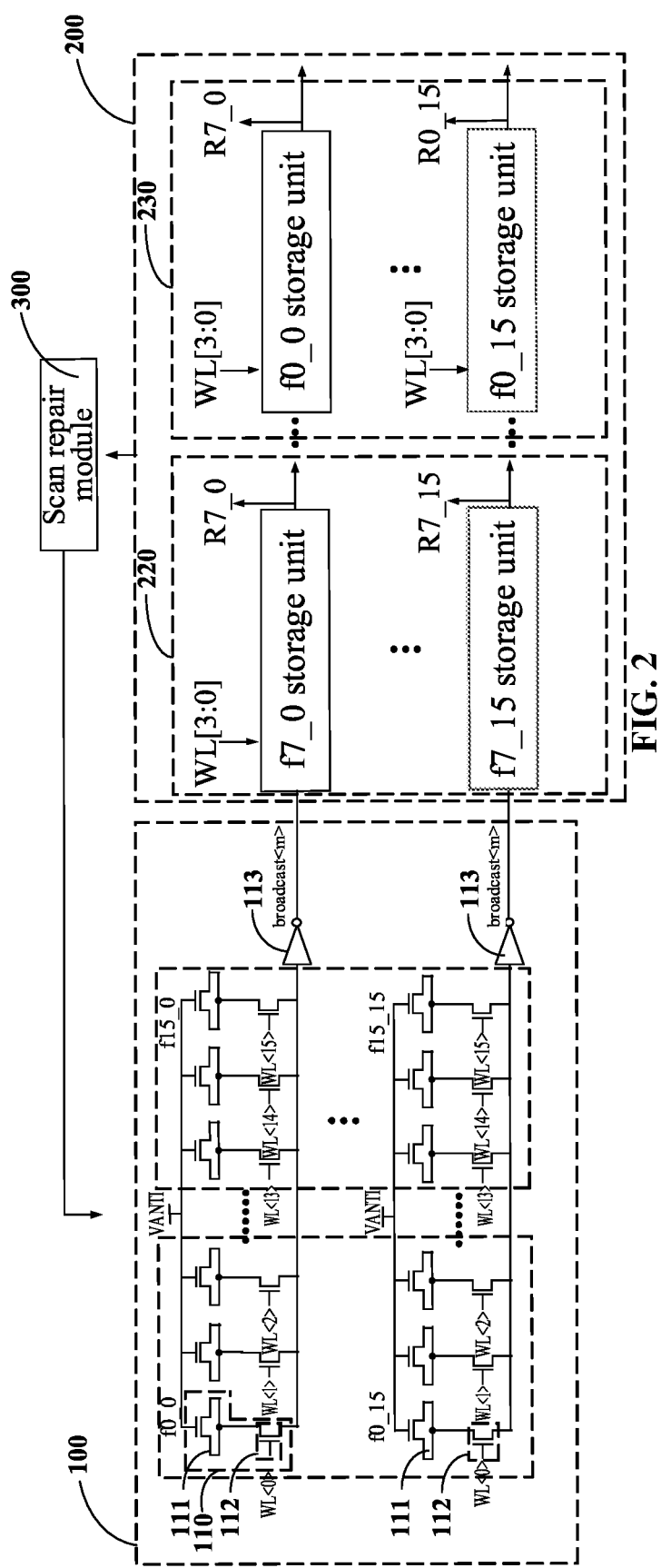
FIG. 2 is a schematic diagram of a fuse fault repair circuit provided in some other embodiments of the disclosure.

As illustrated in FIG. 2, FIG. 2 is a schematic diagram of the fuse array 100 when the value of M is 256, the 256 fuse units 110 are arranged in 16 columns and 16 rows. As illustrated in FIG. 2, each fuse unit 110 is marked with fn_m, where n is used to indicate the column number, and m is used to indicate the row number. For example, f0_0 represents the fuse unit 110 in the first column and first row, f0_15 represents the fuse unit 110 in the first column and 16th row, f15_0 represents the fuse unit 110 in the 16th column and first row, and f15_15 represents the fuse unit 110 in the 16th column and 16th row.

As illustrated in FIG. 2, it is assumed that the non-redundant fuse array 130 in the 256 fuse units 110 occupies 16 rows and eight columns of fuse units 110. Identifiers of fuse units corresponding to the non-redundant fuse array 130 are f0_0, f0_1, f0_2, . . . , f0_15, f1_0, f1_1, f1_2, . . . , f1_15, f2_0, f2_1, f2_2, . . . , f2_15, f3_0, f3_1, f3_2, . . . , f3_15, f4_0, f4_1, f4_2, . . . , f4_15, f5_0, f5_1, f5_2, . . . , f5_15, f6_0, f6_1, f6_2, . . . , f6_15, f7_0, f7_1, f7_2, . . . , and f7_15.

Accordingly, the redundant fuse array 120 in the 256 fuse units 110 occupies the remaining 16 rows and eight columns of fuse units 110. Identifiers of fuse units corresponding to the redundant fuse array 120 are f8_0, f8_1, f8_2, . . . , f8_15, f9_0, f9_1, f9_2, . . . , f9_15, f10_0, f10_1, f10_2, . . . , f10_15, f11_0, f11_1, . . . , f11_2, f11_15, f12_0, f12_1, f12_2, . . . , f12_15, f13_0, f13_1, f13_2, . . . , f13_15, f14_0, f14_1, f14_2, . . . , f14_15, f15_0, f15_1, f15_2, . . . , f15_15.

The signal storage module 200 includes at least M storage units 210. Each of the storage units 210 is configured to store a first logic signal sent by a fuse unit connected thereto 110. When the fuse array 100 sends S first logic signals, the signal storage module 200 needs to store the S first logic signals correspondingly.

In some embodiments, the fuse array 100 is composed of an array of fuse units in N1 rows and L1 columns 110. The at least M storage units 210 form a storage array of N2 rows and L2 columns. N1, L1, N2, and L2 are all integers greater than zero. N2 is greater than or equal to N1, and L2 is greater than or equal to L1. When storing first logic signals output by the fuse array 100, each row of storage units 210 are respectively configured to store first logic signals output by a row of fuse units 110 in the fuse array.

Specifically, referring to FIG. 2, each row of storage units 210 receive a clock sequence broadcast<m>, and sequentially propagate, based on the clock sequence broadcast<m>, the received first logic signals backwards, where m is used to indicate the row number. FIG. 1 is a schematic diagram where first logic signals output by the first row and 16th row of fuse units 110 in a non-redundant fuse array are stored. In FIG. 1, when storing first logic signals output by the first row of fuse units 110 into the first row of storage units 210, the first row of storage units 210 receive a clock sequence broadcast<0>, and sequentially propagate, based on the clock sequence broadcast<0>, the received first logic signals backwards. When storing first logic signals output by the 16th row of fuse units 110 into the 16th row of storage units 210, the 16th row of storage units 210 receive a clock sequence broadcast<15>, and sequentially propagate the received first logic signals backwards based on the clock sequence broadcast<15>.

Furthermore, when each row of storage units 210 receive a clock sequence broadcast<m> correspondingly, and propagate and store the first logic signals based on the clock sequence broadcast<m>, the first logic signals also need to be correspondingly stored according to an address code carried in each first logic signal. Specifically, each of the first logic signals carries an address code. An address code is set for each of the storage units 210. When it is detected that the address code carried in the first logic signal matches the address code of the storage unit 210, the signal storage module 200 stores the first logic signal into the storage unit 210.

As illustrated in FIG. 1, each column of fuse units 110 have a address code WL<n>, where n is used to indicate the column number. The address code of the first column of fuse units 110 is WL<0>, the address code of the second column of fuse units 110 is WL<1>, and so on. Moreover, WL<n> is specifically a four-bit code (which is not illustrated in FIG. 1; in FIG. 1, WL<n> is used to briefly illustrate that each fuse unit 110 has a corresponding address code). That is, each of the fuse units 110 has a corresponding address code WL<n>. Accordingly, as illustrated in FIG. 1, each of the storage units 210 has a address code WL[3:0]. The address code W[3:0] is a four-bit code, and has one-to-one correspondence to WL<n>. For example, when the address code W[3:0] is WL[0000], it indicates that a first logic signal output by a fuse unit 110 having an identifier f0_0 is read. When the address code WL[3:0] is WL[0111], it indicates that a first logic signal output by a fuse unit 110 having an identifier f7_0 is read.

Optionally, the fuse unit 110 includes a fuse 111, a transistor 112, and an inverter 113. One end of the fuse 111 is configured to be connected to the power supply end (VANT illustrated in FIG. 1). A source of the transistor 112 is connected to an output end of the fuse 111. A drain of the transistor 112 is connected to an input end of the signal storage module 200. A gate of the transistor 112 is configured to receive an address code corresponding to the fuse unit 110. The transistor 112 is configured to receive an output signal of the fuse 111, combine the output signal of the fuse 111 and the address code corresponding to the fuse unit 110, and then output the first logic signal. Therefore, the signal storage module 200 can determine an address code of a corresponding fuse unit 110 according to the first logic signal, and then store the first logic signal output by the fuse unit 110 according to the address code matching result of the storage unit 210 and the fuse unit 110. An input end of the inverter 113 is connected to the drain of the transistor 112. An output end of the inverter 113 is connected to the signal storage module 200. The inverter 113 is configured to perform signal processing on the first logic signal, and then output the first logic signal subjected to the signal processing to the signal storage module 200. That is, the signal output by the transistor 112 is performed signal inversion processing by the inverter 113 to generate the first logic signal, which is then stored by the signal storage module 200.

The scan repair module 300 is in signal connection to the signal storage module 200. After the signal storage module 200 completes storing S first logic signals output by the fuse array 100, the scan repair module 300 is configured to scan the storage units 210 in the signal storage module 200, and determine, when a faulty storage unit 211 has been scanned, that a first fuse unit 140 connected to the faulty storage unit 211 is faulty. The first logic signal stored in the faulty storage unit 211 is a fault signal. The fault signal has identifiers such as 0 and 1. Taking an identifier 1 of the fault signal as an example, upon having detected that an identifier of a first logic signal in a certain storage unit 210 is 1, the scan repair module 300 determines that the certain storage unit 210 is the faulty storage unit 211.

Optionally, as illustrated in FIG. 2, each storage unit 210 has a state mark Rn_m, where n is an identifier used for indicating the column, and m is an identifier used for indicating the row. The state mark is used for marking the first logic signal stored in the storage unit as a normal signal or a fault signal. The scan repair module 300 is specifically configured to scan the state mark of the storage unit 210 in the signal storage module 200, and determine, according to the state mark of the storage unit 210, whether the storage unit is the faulty storage unit 211. It is assumed that the state mark "0" of the storage unit 210 indicates the normality, that is, Rn_m=0 indicates the normality, and the state mark "1" of the storage unit 210 indicates the fault, that is, Rn_m=1 indicates the fault. When scanning that the state mark of a certain storage unit 210 is "1", that is, Rn_m=1, the scan repair module 300 determines that the certain storage unit 210 is the faulty storage unit 211.

Optionally, the scan repair module 300 is further configured to receive a scan code, and scan a storage unit 210 according to the scan code. The scan code includes the address code of the storage unit 210. That is, the scan repair module 300 does not need to scan all the storage units 210 in the signal storage module 200, but only needs to scan a corresponding storage unit 210 according to the scan code, which reduces the work load of the scan repair module 300.

After determining the faulty storage unit 211, the scan repair module 300 replaces the first fuse unit 140 corresponding to the faulty storage unit 211 with a first redundant fuse unit 150 corresponding to the first fuse unit 140. The first redundant fuse unit 150 belongs to the redundant fuse array. The first logic signal corresponding to the first redundant fuse unit 150 is a normal signal. That is, after determining the faulty storage unit 211, the scan repair module 300 replaces a faulty fuse unit in a non-redundant fuse array 130 with any one or a specific fuse unit in a redundant fuse array 120 of the fuse array 100, so as to complete repairing the non-redundant fuse array 130 of the fuse array 100.

Optionally, the scan repair module 300 includes a scan logic 310 and a repair logic 320. The scan logic 310 is configured to scan the storage units 210 in the signal storage module 200, determine, when scanning the fault signal, that the storage unit 210 containing the fault signal is the faulty storage unit 211, and send a repair signal to the repair logic 320. Upon receipt of the repair signal, the repair logic 320 determines the first redundant fuse unit 150 corresponding to the first fuse unit 140 from the redundant fuse array, and shifts the first redundant fuse unit 150 to the position of the first fuse unit 140, so as to complete repairing the redundant fuse array. An indication can be set for the repair logic 320 to determine the position of the first fuse unit 140 based on the repair signal sent by the scan logic 310.

Optionally, after determining the row and column where the first fuse unit 140 is located, the scan repair module 300 determines, according to the row and column where the first fuse unit 140 is located, the row and column where the first redundant fuse unit 150 is located. The column where the first fuse unit 140 is located and the column where the first redundant fuse unit 150 is located are symmetric columns. The row where the first fuse unit 140 is located is the same as the row where the first redundant fuse unit 150 is located. For example, as illustrated in FIG. 1, if an identifier of the first fuse unit 140 is f0_0, that is, the column number of the column where the first fuse unit 140 is located is 1, an identifier of the first redundant fuse unit 150 is f15_0. At this time, the column number of the column where the first redundant fuse unit 150 is located is 16. If an identifier of the first fuse unit 140 is f2_0, that is, the column number of the column where the first fuse unit 140 is located is 3, an identifier of the first redundant fuse unit 150 is f13_0. At this time, the column number of the column where the first redundant fuse unit 150 is located is 14. If an identifier of the first fuse unit 140 is f3_1, that is, the column number of the column where the first fuse unit 140 is located is 4, an identifier of the first redundant fuse unit 150 is f12_0. At this time, the column number of the column where the first redundant fuse unit 150 is located is 13.

In conclusion, the fuse fault repair circuit 10 provided in the embodiment scans the storage units 210 in the signal storage module 200 by using the scan repair module 300, and replaces the first fuse unit 140 with the first redundant fuse unit 150 corresponding to the first fuse unit 140 when the faulty storage unit 211 is scanned, so as to complete repairing the faulty non-redundant fuse array 130. Therefore, the fuse fault repair circuit 10 provided in the embodiment can ensure that the semiconductor memory can still be normally used when the electronic fuse is faulty, which avoids a great waste of the electronic fuse semiconductor memory.

Figure 3:
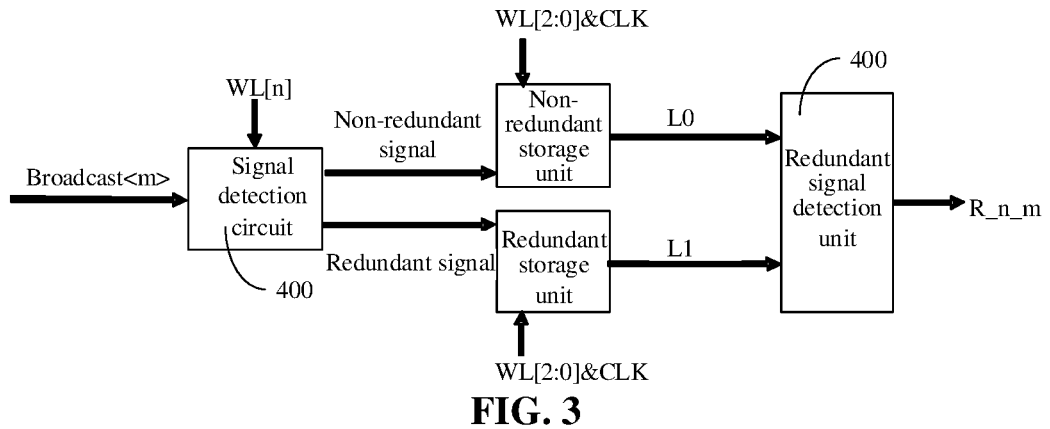
FIG. 3 is a schematic diagram of a signal storage module provided in some embodiments of the disclosure.

As illustrated in FIG. 2 and FIG. 3, in some embodiments, the M storage units 210 include a redundant storage unit 220 and a non-redundant storage unit 230. The signal storage module 200 further includes a signal detection circuit 240. An input end of the signal detection circuit 240 is connected to an output end of the fuse array 100. An output end of the signal detection circuit 240 is connected to the at least M storage units 210. When the signal detection circuit 240 detects that the first logic signal is a redundant signal, the signal detection module 200 stores the first logic signal into the redundant storage unit 220. When the signal detection circuit 240 detects that the first logic signal is a non-redundant signal, the signal detection module 200 stores the first logic signal into the non-redundant storage unit 230.

As illustrated in FIG. 3, the signal detection circuit 240 receives the clock sequence broadcast<m> and WL<n>, where broadcast<m> is used for driving a signal to be propagated, and WL<n> is an identifier of the first logic signal. Optionally, when WL<n>=0, it indicates that the first logic signal is a non-redundant signal, and the signal detection module 200 stores the first logic signal into the non-redundant storage unit 230. When WL<n>=1, it indicates that the first logic signal is a redundant signal, and the signal detection module 200 stores the first logic signal into the redundant storage unit 220.

It should be noted that when the non-redundant fuse array 130 is not faulty, the faulty non-redundant fuse unit is not replaced with the redundant fuse unit. At this time, the first logic signals output by the fuse array 100 are all non-redundant signals. Accordingly, when the signal detection module 200 stores the first logic signals, the redundant storage unit 220 has no signal stored therein. However, when the non-redundant fuse array 130 is faulty, the first fuse unit 140 is replaced with the first redundant fuse unit 150. At this time, the first logic signals output by the fuse array 100 include logic signals which are redundant signals. Accordingly, when the signal detection module 200 stores the first logic signals, the redundant storage unit 220 has a signal stored therein.

Optionally, the fuse fault repair circuit 10 is correspondingly provided with a redundant signal detection unit 400. The redundant signal detection unit 400 is connected to an output end of the redundant storage unit 220. When the redundant storage unit 220 has a signal stored therein, the redundant signal detection unit 400 outputs a fault repair signal. When the redundant signal detection unit 400 detects the fault repair signal, it proves that the non-redundant fuse array 130 in the fuse array 100 is faulty, and has been replaced and repaired by the redundant fuse array 120.

The fault repair signal is L1 illustrated in FIG. 3. Once the redundant signal detection unit 400 detects that L1=1, it proves that the redundant storage unit 220 has the first logic signal stored therein, and the non-redundant fuse array 130 is faulty, and has been replaced and repaired by the redundant fuse array 120.

In some embodiments, the first storage unit 210 in the signal storage module 200 is further configured to receive a clock drive pulse. When the clock drive pulse is a first pulse, the first storage unit 210 interrupts the storage of a signal in an adjacent storage unit 210 in the same row. When the signal storage module 200 stores the first logic signal, the storage units 210 in the same row store data in sequence. The adjacent storage unit 210 is the next unit in which a signal is to be stored.

As illustrated in FIG. 2, the redundant storage unit 220 and the non-redundant storage unit 230 respectively receive a drive clock WL[2:0]&CLK. If the first pulse is set as other codes other than [111], when WL[2:0] is not equal to [111], for example, WL[2:0] is equal to [000], the drive clock WL[2:0]&CLK drives the storage unit 210 to continue to propagate the first logic signal backwards; and when WL[2:0] is equal to [111], the storage unit 210 stops continuing to propagate the first logic signal backwards.

In conclusion, in the embodiment, the signal storage module 200 identifies and stores the first logic signals according to storage forms of the redundant storage unit 220 and the non-redundant storage unit 230. That is, when being output by the non-redundant fuse array 130, the first logic signal is stored into the non-redundant storage unit 230. However, when the non-redundant fuse array 130 is faulty, and replaced and repaired by the redundant fuse array 120, the first logic signal, which is output by the first redundant fuse unit 150 used for replacing and repairing, is stored into the redundant storage unit 220. In the embodiment, a redundant signal detection unit 400 is also arranged. When it is detected that the redundant storage unit 220 has a signal stored therein, the redundant signal detection unit 400 outputs the fault repair signal. The fault repair signal can be displayed on the user interface, so that the worker knows that the fuse array 100 has completed an automatic repair, which is helpful for the worker to monitor the state of the fuse array.

Figure 4:
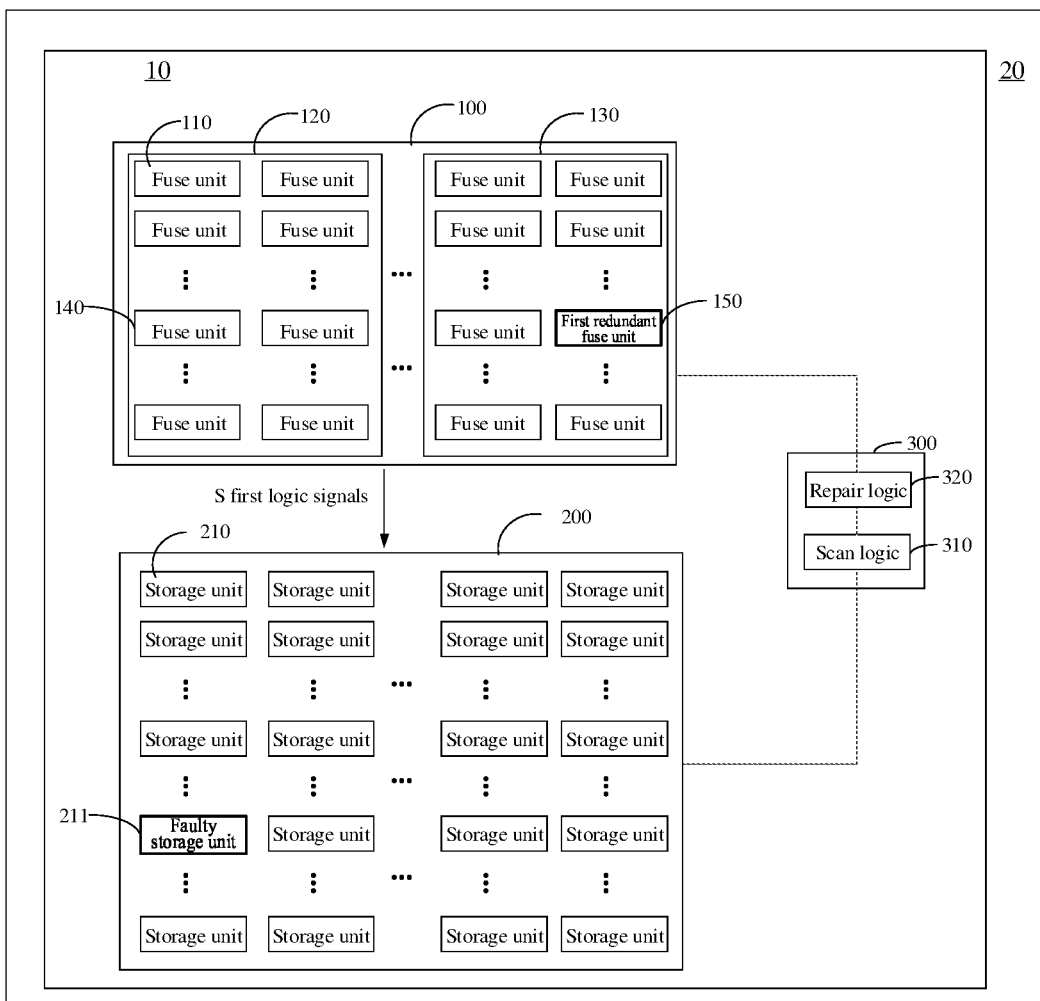
FIG. 4 is a schematic diagram of an electrical fuse memory provided in some embodiments of the disclosure.

Referring to FIG. 4, one embodiment of the disclosure provides an electrical fuse memory 20. The electrical fuse memory 20 includes the fuse fault repair circuit 10 provided in any one of the foregoing embodiments. The electrical fuse memory 20 can further include other configured elements, which is not limited in the disclosure.

A person skilled in the art can easily figure out other implementation solutions of the disclosure after considering the description and practicing the application disclosed here. The disclosure is intended to cover any variations, functions, or adaptive changes of the disclosure. These variations, functions, or adaptive changes comply with general principles of the disclosure, and include common general knowledge or common technical means in the technical field that are not disclosed in the disclosure. The description and embodiments are merely considered to be exemplary, and the actual scope and spirit of the disclosure are pointed out in the following claims.

It should be understood that the disclosure does not limit at an accurate structure that is described above and illustrated in the drawings, and can be modified and changed in every way without departing from the scope thereof. The scope of the disclosure is limited only by the attached claims.

The invention claimed is:

1. A fuse fault repair circuit, comprising:
a fuse array, of which an input end is configured to be connected to a power supply end, and an output end is configured to output S first logic signals, wherein the fuse array comprises M fuse units; each of the fuse units outputs one first logic signal, S and M are both integers greater than zero, and S is less than M; the M fuse units comprise a redundant fuse array and a non-redundant fuse array, the redundant fuse array has no signal output when the fuse array is not faulty, and the non-redundant fuse array outputs the S first logic signals;
a signal storage module, comprising at least M storage units, each of the storage units being configured to store a first logic signal sent by one fuse unit connected thereto; and
a scan repair module in signal connection with the signal storage module, configured to scan the storage units in the signal storage module, determine, when a faulty storage unit has been scanned, that a first fuse unit connected to the faulty storage unit is faulty, and replace the first fuse unit with a first redundant fuse unit corresponding to the first fuse unit, wherein a first logic signal stored in the faulty storage unit is a fault signal, the first redundant fuse unit belongs to the redundant fuse array, and a first logic signal corresponding to the first redundant fuse unit is a normal signal.

2. The fuse fault repair circuit of claim 1, wherein each storage unit has a state mark, and the state mark is used for marking a first logic signal stored in the storage unit as a normal signal or a fault signal;
wherein the scan repair module is configured to scan the state mark of each storage unit in the signal storage module, and determine, according to the state mark of the storage unit, whether the storage unit is the faulty storage unit.

3. The fuse fault repair circuit of claim 1, wherein the at least M storage units comprise a redundant storage unit and a non-redundant storage unit;
   wherein the signal storage module further comprises a signal detection circuit, an input end of the signal detection circuit is connected to an output end of the fuse array, and an output end of the signal detection circuit is connected to the at least M storage units;
   wherein when the first logic signal is a redundant signal, the first logic signal is stored into the redundant storage unit; and
   wherein when the first logic signal is a non-redundant signal, the first logic signal is stored into the non-redundant storage unit.

4. The fuse fault repair circuit of claim 3, further comprising:
   a redundant signal detection unit, connected to an output end of the redundant storage unit,
   wherein the redundant signal detection unit outputs a fault repair signal when the redundant storage unit has a signal stored therein.

5. The fuse fault repair circuit of claim 1, wherein the fuse array is composed of an array of fuse units in N1 rows and L1 columns, the at least M storage units form a storage array of N2 rows and L2 columns, N2 is greater than or equal to N1, and L2 is greater than or equal to L1;
   wherein each row of storage units are respectively configured to store first logic signals which are output by a row of fuse units in the fuse array.

6. The fuse fault repair circuit of claim 5, wherein the first storage unit in the signal storage module is further configured to receive a clock drive pulse;
   wherein when the clock drive pulse is a first pulse, the first storage unit interrupts the storage of a signal in an adjacent storage unit in a same row, the storage units in the same row store data in sequence, and the adjacent storage unit is the next unit in which a signal is to be stored.

7. The fuse fault repair circuit of claim 5, wherein after determining the row and column where the first fuse unit is located, the scan repair module determines, according to the row and column where the first fuse unit is located, the row and column where the first redundant fuse unit is located, wherein the column where the first fuse unit is located and the column where the first redundant fuse unit is located are symmetric columns, the row where the first fuse unit is located is same as the row where the first redundant fuse unit is located, and the symmetric columns mean that a sum of column numbers of any two columns is equal to a sum of column numbers of any other two columns.

8. The fuse fault repair circuit of claim 1, wherein each of the first logic signals carries an address code, and an address code is set for each of the storage units;
   wherein the signal storage module stores the first logic signal into the storage unit when it is detected that the address code carried in the first logic signal matches the address code of the storage unit.

9. The fuse fault repair circuit of claim 8, wherein the fuse unit comprises:
   a fuse, of which one end is configured to be connected to the power supply end; and
   a transistor, of which a source is connected to an output end of the fuse, a drain is connected to an input end of the signal storage module, and a gate is configured to receive an address code corresponding to the fuse unit;
   wherein the transistor is configured to receive an output signal of the fuse, combine the output signal of the fuse and the address code corresponding to the fuse unit, and then output the first logic signal.

10. The fuse fault repair circuit of claim 9, further comprising:
    an inverter, of which an input end is connected to the drain of the transistor, and an output end is connected to the signal storage module, wherein the inverter is configured to perform signal processing on the first logic signal, and then output the first logic signal subjected to the signal processing to the signal storage module.

11. The fuse fault repair circuit of claim 8, wherein the scan repair module is further configured to receive a scan code, and scan a storage unit according to the scan code;
    wherein the scan code comprises the address code of the storage unit.

12. An electrical fuse memory, comprising the fuse fault repair circuit of claim 1.

* * * * *